United States Patent
Beste

(10) Patent No.: US 6,369,354 B1
(45) Date of Patent: Apr. 9, 2002

(54) EXCIMER LASER ABLATION PROCESS CONTROL OF MULTILAMINATE MATERIALS

(75) Inventor: Russell D. Beste, Mountain View, CA (US)

(73) Assignee: Aradigm Corporation, Hayward, CA (US)

( * ) Notice: Subject to any disclaimer, the term of this patent is extended or adjusted under 35 U.S.C. 154(b) by 0 days.

(21) Appl. No.: 09/616,582

(22) Filed: Jul. 14, 2000

Related U.S. Application Data

(63) Continuation-in-part of application No. 09/353,125, filed on Jul. 14, 1999, now Pat. No. 6,288,360.

(51) Int. Cl.[7] .......................... B23K 26/38; B23K 26/40
(52) U.S. Cl. ................... 219/121.71; 156/292
(58) Field of Search .......................... 219/121.6, 121.7, 219/121.71; 156/292; 216/65

(56) References Cited

U.S. PATENT DOCUMENTS

| | | | |
|---|---|---|---|
| 4,508,749 A | 4/1985 | Brannon et al. | 427/43.1 |
| 5,236,551 A | 8/1993 | Pan | 156/643 |
| 5,296,291 A | 3/1994 | Mueller | 428/349 |
| 5,455,998 A | 10/1995 | Miyazono et al. | 219/121.71 |
| 5,536,579 A | 7/1996 | Davis et al. | 428/421 |
| 6,288,360 B1 * | 9/2001 | Beste | 219/121.71 |

* cited by examiner

*Primary Examiner*—Geoffrey S. Evans
(74) *Attorney, Agent, or Firm*—Alan W. Cannon; Bozicevic, Field & Francis LLP

(57) ABSTRACT

A method of ablating holes in a material, using a laminated material which includes first and second layers. The first and second layers have different coefficients of thermal expansion. The first layer has a hole within it surrounding a target region of the second layer in the laminated material. Thus, the target region is not laminated to the second layer but is surrounded entirely by laminated regions wherein the first layer is laminated to the second layer. A laser source producing energy of a wavelength and a power level that can ablate material from the first layer is directed toward the target region after and/or during changing the temperature of the laminated material so as to place the target region under tension, thereafter ablation of the target region produces the desired holes.

19 Claims, 4 Drawing Sheets

EXCIMER LASER ABLATION PROCESS CONTROL OF MULTILAMINATE MATERIALS

CONTINUING DATA

This application is a continuation-in-part of application Ser. No. 09/353,125 filed on Jul. 14, 1999, now U.S. Pat. No. 6,288,360.

TECHNICAL FIELD

The invention relates to a process for ablating small holes in to multiple layers of material and particularly to a method of preventing deformation of a layer of material into which holes are drilled via an Excimer LASER.

BACKGROUND OF THE INVENTION

The use of ablation patterning of various polymeric materials, e.g., polyimides, is known. U.S. Pat. No. 4,508,749, for example, disclosed the use of ultraviolet (U.V.) radiation for etching through a polyimide layer. This patent is primarily directed to producing tapered openings through a polyimide layer for exposing surface areas of an underlying layer of metal. Electrical connections are then made through the openings to the metal layer. U.S. Pat. No. 5,236,551 likewise disclosed ablation etching for patterning a polymeric material layer which is then used as an etch mask for etch patterning, using wet or chemical etchants, an underlying layer of metal.

In a typical ablation process, a beam of laser energy is directed against an exposed surface of a body to be ablated. The laser energy is absorbed by the material and, as a result of photochemical, thermal and other effects, localized explosions of the material occur, driving away, for each explosion, tiny fragments of the material. The process requires that significant amounts of energy be both absorbed and retained within small volumes of the material until sufficient energy is accumulated in each small volume to exceed a threshold energy density at which explosions occur.

Polymeric materials, such as polyimides, are well suited for use in the process because such materials have a high absorptivity for U.V. light while having a relatively low thermal diffusivity for limiting the spread of the absorbed energy away from the volume where the energy was absorbed. Thus, the energy level quickly builds above the required energy density threshold.

When an excimer laser is used, because of the unique optical focusing requirements of the excimer laser it is important to the manufacturing process that the material to be ablated be flat, with a typical peak-to peak roughness of less than about 20 microns, i.e., ±10 microns for a given ablation operation. This need and others are addressed by the instant invention.

SUMMARY OF THE INVENTION

The present invention is directed toward improving the results of a laser ablation process of a thin film in which holes are ablated through the film. A method of ablating a film according to the present invention involves placing the thin film under such conditions to cause it to come under tension so as to remove wrinkles that may be present in the film, thereby orienting the surface of the film substantially in a single plane to allow precise and accurate ablation of multiple holes in the film simultaneously by applying laser energy to it.

In one example, a thin layer is laminated with an additional layer to form a laminate under conditions comprising a first temperature, and then pulses of LASER energy are directed at the laminate, under conditions comprising a second temperature, in a manner which results in holes being drilled in the thin layer. The first temperature is different from the second temperature and the thin layer has a coefficient of thermal expansion different from a coefficient of thermal expansion of the additional layer, such that after laminating at the first temperature, the additional layer places the thin layer under tension at the second temperature.

The first temperature is greater than the second temperature when the coefficient of thermal expansion of the additional layer is less than that of the thin layer, and vice versa. The thin layer preferably comprises polyimide, while the additional layer can be made of various different materials. However, the principles of the present invention apply equally to thin layers other than polyimide.

When the second temperature is higher than the first, the second temperature may be achieved, at least partially, through absorption of laser energy by the additional layer. Heating or cooling during the ablation process can be achieved or supplemented by heating or cooling an ablation chuck, which interfaces the laminate during the ablation process.

A method of preparing a laminated material for laser ablation is provided, which includes laminating a first layer to a second layer, wherein the first and second layers have different coefficients of thermal expansion, and wherein the second layer has an interior hole such that when the laminated substrate is formed, a region of the first layer aligned with the hole is not laminated to the second layer and is surrounded by laminated regions.

A laminated material is provided, which includes first and second layers, wherein the first and second layers have different coefficients of thermal expansion, and wherein the second layer has an interior hole such that a region of the first layer aligned with said hole is not laminated to the second layer and is surrounded by laminated regions.

DETAILED DESCRIPTION OF THE INVENTION

Figure 1:
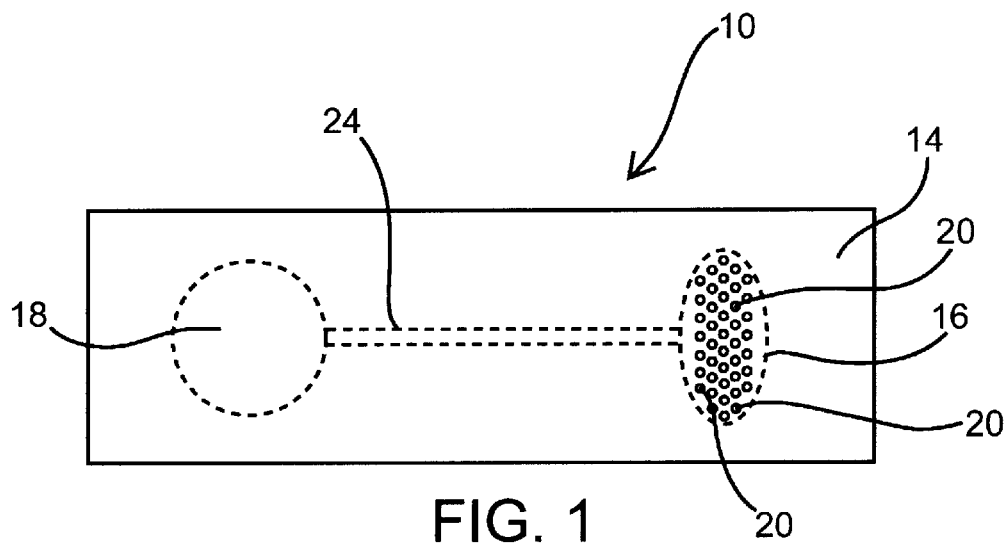
FIG. 1 is a top view which schematically shows a drug delivery strip or dosage form for use in an inhalant device.

Before the present method of excimer laser ablation process control is described, it is to be understood that this invention is not limited to the particular methodology, devices and formulations described, as such methods, devices and formulations may, of course, vary. It is also to be understood that the terminology used herein is for the purpose of describing particular embodiments only, and is not intended to limit the scope of the present invention which will be limited only by the appended claims.

It must be noted that as used herein and in the appended claims, the singular forms "a," "and," and "the" include plural referents unless the context clearly dictates otherwise. Thus, for example, reference to "a formulation" includes mixtures of different formulations, reference to "an analog" refers to one or mixtures of analogs, and reference to "the method of treatment" includes reference to equivalent steps and methods known to those skilled in the art, and so forth.

Unless defined otherwise, all technical and scientific terms used herein have the same meaning as commonly understood by one of ordinary skill in the art to which this invention belongs. Although any methods, devices and materials similar or equivalent to those described herein can be used in the practice or testing of the invention, the preferred methods, devices and materials are now described. All publications mentioned herein are incorporated herein by reference in their entirety for the purpose of describing and disclosing devices, formulations and methodologies which are described in the publication and which might be used in connection with the presently described invention.

Excimer laser ablation enables precise drilling and/or ablation processes to less than one micron. To be useful, however, many such ablated devices must be laminated to other polymeric materials, whether for structural and/or for functional reasons. Since the ablation process is often very precise, it is useful from a manufacturing point of view in many instances to ablate the polymer after the lamination process. Furthermore, because of the unique optical focusing requirements of the excimer laser it is important to the manufacturing process that the material to be ablated be flat, with a typical peak-to peak roughness of less than about 20 microns, i.e., ±10 microns for a given ablation operation.

The typical material of choice for excimer laser ablation is polyimide. However, the thermal expansion coefficient of polyamide is about $5 \times 10^{-6}$ cm/cm ° C., characterizing it a having the lowest coefficient of thermal expansion of the most commonly used polymers. Since polyimide has the lowest coefficient of expansion of most commonly used polymers, maintaining requisite flatness during an ablation process can be very difficult, as any change in temperature can cause materials (e.g., the polyimide component of the multilaminate) to come under compression. Further, and possibly even a more common occurrence, is that the polyimide layer can become wrinkled during the lamination process, prior to excimer laser treatment. In these scenarios, surface flatness is not maintained and the drilling process becomes imprecise. In order to maintain surface flatness for an ablation operation, it is desirable that the ablated material be under surface tension relative to its laminate layer.

The instant invention addresses this problem in a method which comprises providing a laminated material comprising first and second layers, where the first and second layers have different coefficients of thermal expansion. Referring now to the figures, an example of the present invention is described with application to the formation of a nozzle portion of an inhalant device. However, it is noted that the present invention is, of course, not limited to this particular application, which is merely one specific example of how the inventive process and materials can be used.

Referring to FIG. 1, a top view of a drug delivery strip or dosage form 10 for use in an inhalant device is shown. Dosage form 10 includes a nozzle lid laminate 30, which is a laminate of a lid layer 12 (see FIG. 2), such as a metallic strip, e.g., of Aluminum, or other relatively thick layer providing structural support, and a nozzle layer 14 into which nozzle 16 is formed. The nozzle lid laminate 30 is additionally laminated to a blister layer 22. A well 18 is formed in blister layer 22 to provide storage or capacitance for a liquid supply of a drug to be dispensed. A channel 24 interconnects the well 18 with the nozzle 16, and is preferably formed in the blister layer 22.

The blister layer 22 may be formed of ACLAR® (a polychloro trifluoroethylene compound available from Allied Signal), and the well 18 is formed during a deformation processing of the layer 22. The channel 24 may be deformed or etched or otherwise mechanically formed into the film 22.

The nozzle lid laminate 30, in one example, is formed from a top layer or nozzle layer 14 comprising KAPTON® (a polyimide film available from DuPont) which is laminated to a lid layer 12 which, in this case, comprises Aluminum, although other materials could be used as discussed both above and below. As discussed above, the lamination process itself may cause some wrinkling of the nozzle layer 14 as it is laminated to the lid layer 12, which is one of the phenomena that the present invention is designed to address.

Figure 3:
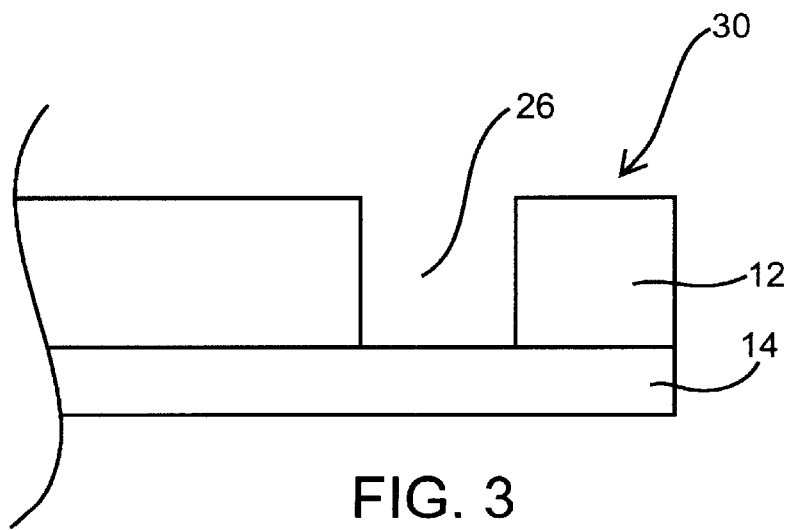
FIG. 3 is a partial side view of an example of a nozzle lid laminate, prior to a drilling procedure according to the present invention.

FIG. 3 is a partial side view of an example of a nozzle lid laminate, prior to a drilling procedure according to the present invention. The lid layer 12 is provided with a hole 26 which, upon interfacing the lid and nozzle layers, outlines the area in which the nozzle 16 is to be formed in the nozzle layer 14. The nozzle layer 14 is provided with a pressure sensitive adhesive (PSA) on the surface which interfaces with the lid layer 12 and bonds the two layers together to form the laminate.

Figure 4:
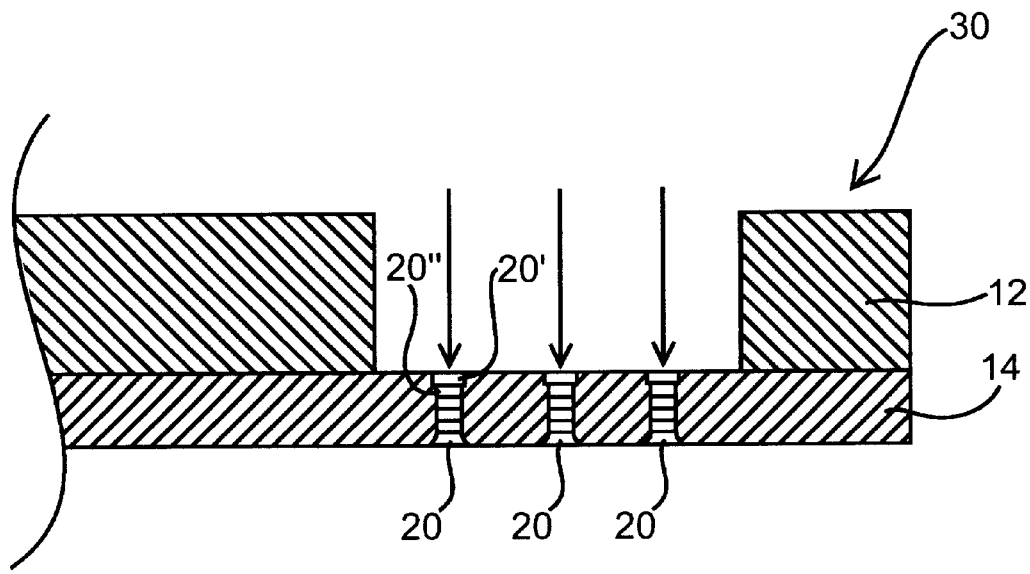
FIG. 4 is a sectional view of FIG. 3 which schematically shows the formation or drilling of holes through the nozzle layer.
Figure 5:
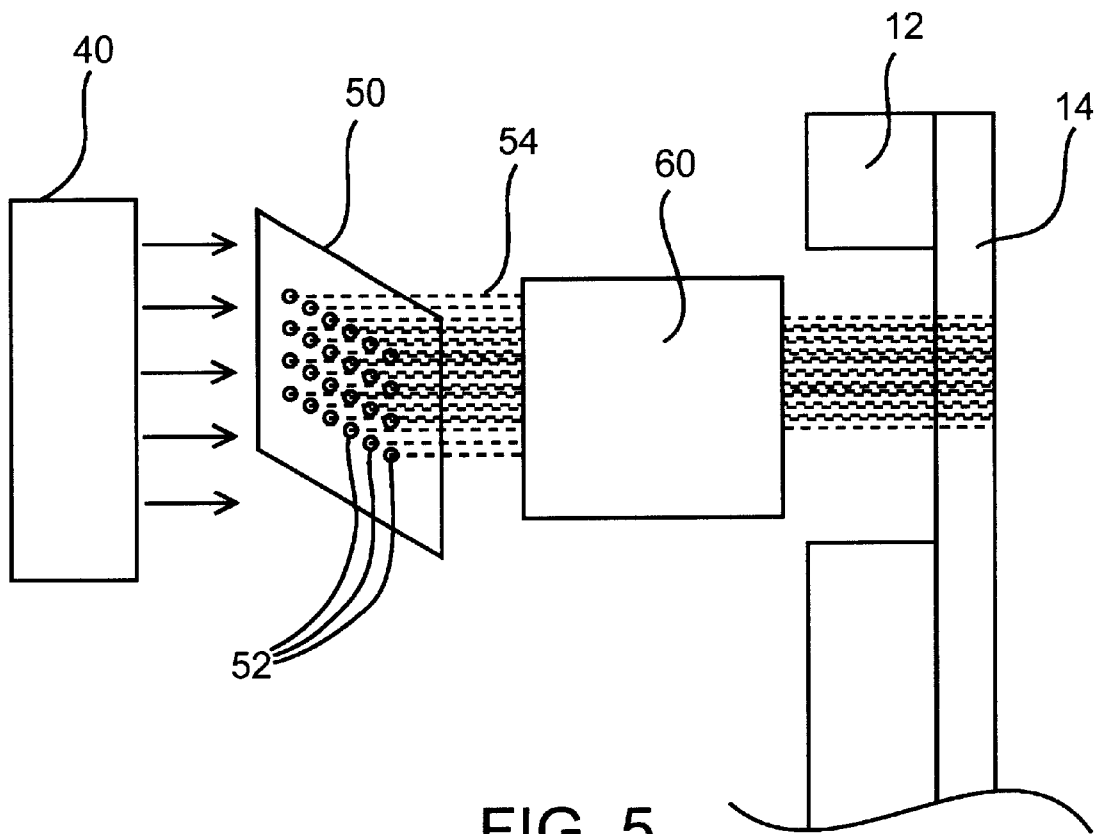
FIG. 5 is a schematic view of a setup including a laser, mask, objective and target used in an ablation process according to the present invention.
Figure 6:
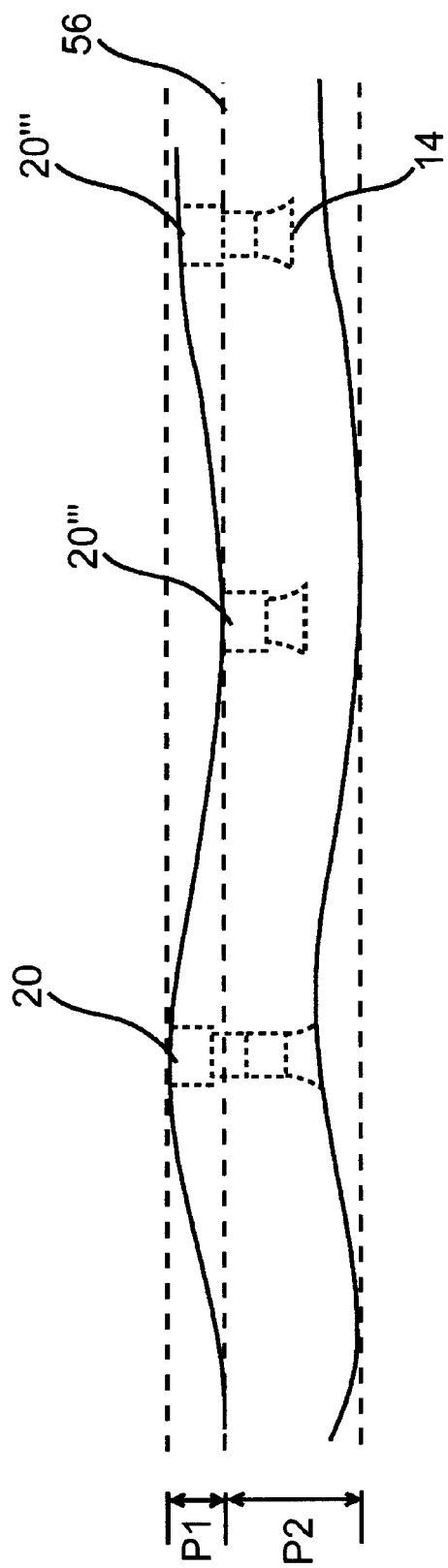
FIG. 6 is a schematic of a representative sample of a thin layer having wrinkles.

FIG. 4 is a sectional view of FIG. 3 which schematically shows the formation or drilling of holes 20 through the nozzle layer 14. For simplicity, only three holes are shown in this view, when in actuality an array of hundreds of holes 20 are drilled simultaneously according to the present invention. As schematically shown in FIG. 5, a mask 50 is formed with a plurality of through holes 52 which are also arranged in an array that is intended to be formed on the nozzle. The size of the holes 52 correspond to the size of holes 20 to be formed in the nozzle. An excimer laser 40 directs a beam of light having a rectangular cross section, for example perpendicularly against the mask 50. The mask allows only shafts of light 54 through the holes 52, which are arranged in the desired array. The shafts of light 54 are then collimated through an objective lens 60 and focused upon the nozzle layer 14 in the desired nozzle area 16.

Figure 7:
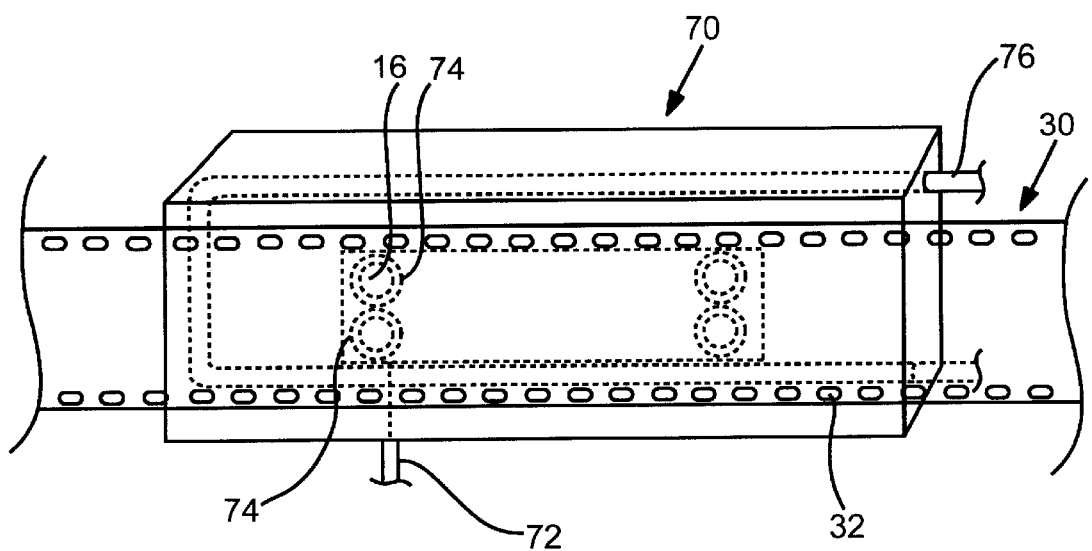
FIG. 7 is a schematic drawing of a nozzle lid laminate held by an ablation chuck in preparation for ablation.

The excimer laser ablation process enables precise drilling and/or ablation processes to less than one micron, as noted above. To be useful, the nozzle layer 14 must be substantially flat, with a typical peak-to peak roughness of less than about 20 microns, i.e., ±10 microns for a given ablation operation. Assuming that the nozzle layer is substantially flat, then the drilling procedure progresses as shown schematically in FIG. 4. That is, the shafts of light 54 are focused upon a focal plane that should be coincident with the material that is intended to be ablated, i.e., the surface of the nozzle layer 14. The laser operates under a pulsed frequency, e.g., 300 Hz. With each activation or pulse of the laser 40, the shafts of light 54 etch a portion of the polymer layer that absorbs the energy of the shafts of light and is ablated by it. Thus, for example, the first pulse ablates to a depth 20', the next pulse to a depth 20", and so forth, until enough pulses have been applied to ablate or "drill" all the way through the nozzle layer to form holes 20. The diameter of each layer of ablation can be adjusted by changing, or programming parameters of the laser to change with different pulses (e.g., intensity, or other parameters, as known) so as to shape the through holes 20 to a nozzle shape or other desired conformation. As long as the nozzle layer is flat, the drilling of all holes proceeds simultaneously and the result is a uniform matrix of holes in the nozzle that functions appropriately in delivering an aerosol of medication as intended. For example, with a polyimide layer having a thickness of about 25 $\mu$m the application of about 100–125 pulses of the excimer laser operating at a pulse frequency of 300 Hz and 308 nm wavelength will complete the hole drilling procedure. This procedure takes about 400 msec.

However, if the nozzle layer is significantly out of flat, wrinkled, etc. in the area where the nozzle 16 is to be formed, then a malformed matrix results. FIG. 6 is an exaggerated representation of a nozzle layer 14 that is not flat. In order for the polymeric material in the layer 14 to be ablated, it must absorb a sufficient amount of energy from the laser beam, as described above. The only material that absorbs a sufficient amount of energy is that material which is in the location of the focus of the beam. In FIG. 6, the phantom line 56 represents the focal plane of the light rays emitted by the excimer laser 40 through mask 50 and focused by objective 60 onto the plane 56. Of course, the plane is incrementally adjusted downwardly with each pulse. When the variation "P1" of the film 14 exceeds 10 microns or P2 exceeds −10 microns, as shown in FIG. 6, those portions of the film which are out of the focal plane do not line up properly so as to fully form a through hole 20. These malformed through holes are shown by 20''' in FIG. 6. Consequently, the matrix resulting in the nozzle of such a wrinkled film will not contain the intended number of holes and will not evenly distribute the aerosol as intended. Such a result is unacceptable and it is therefor imperative that the film 14 be maintained substantially flat during processing (drilling).

Therefor, it is paramount that the nozzle layer 14 be oriented as completely flat as possible at least in the nozzle forming area, where the drilling process is carried out. As mentioned above, the nozzle layer 14 can develop wrinkles even during the lamination process with the lid layer 12. The lamination of the nozzle layer 14 and the lid layer 12 are performed by a vendor (Plitek, Chicago, Ill.).

One measure which can be taken to eliminate wrinkles that may have been formed during the formation of the nozzle lid laminate is to take advantage of the difference between the coefficients of thermal expansion between the nozzle layer 14 and the lid layer 12. It is important then to choose materials which have at least a 10% difference between the respective coefficients. In the example, where the lid layer 12 comprises aluminum, and the nozzle layer 14 comprises polyimide, the 10% differential is far exceeded. However, these concepts apply to other material or materials, of course. In the instant example, the lamination of the lid layer 12 and the nozzle layer can be accomplished at a reduced temperature, say −5 to −10° C., for example. The drilling process using the excimer laser can then be carried out at an elevated temperature of about 25° C. ±5° C. The physical consequences of these treatments are that, at the reduced temperature, the aluminum layer tends to contract or "shrink" more than the polyimide layer, due to its greater coefficient of thermal expansion. Conversely, after lamination, when the layers are married, and when the temperature is elevated, the aluminum layer expands more than the polyimide layer. However, since the layers are married, the aluminum layer pulls the polyimide layer along with it as it expands. The result is that the polyimide layer is expanded, or stretched out, thereby effectively eliminating wrinkles that may have occurred during the lamination process.

In another example, the lamination may be carried out between an ACLAR layer and a polyimide layer. The thermal coefficient of polyimide is about $5\times10^{-6}$ cm/cm/° C., whereas the thermal coefficient of ACLAR is about $1\times10^{-4}$ cm/cm/° C. Since the two thermal coefficients are greater than about 10% different, heating and cooling processes will also be advantageous in eliminating wrinkles from the polyimide layer which may be formed when these materials are laminated. In this example, the lamination process may be carried out at about 25° C.±5° C., and the subsequent ablation (or drilling) process may be carried out at about −5° C. In this example, a 30° C. temperature differential is created between the subsequent processes. For a 1 cm length sample of this laminate, the temperature differential would cause a change in length of 0.003 cm (30 $\mu$m) in the polyamide layer, thereby removing wrinkles in the material, since the polyimide layer shrinks more than the ACLAR layer.

Thus, in an embodiment where cooling of the laminate 30 places the nozzle layer 14 in tension, the lamination process (i.e., process of laminating the nozzle lid laminate) will be conducted at an elevated temperature relative to the temperature at which the material will be drilled or ablated. In an example where polyimide is laminated to polyethylene, upon cooling after the lamination process, the polyethylene shrinks more than the polyimide, thereby putting the polyimide in tension. Typically, in this series of processes, a small window 26, relative to the total size of the laminate 30, is produced or cut out, such that, upon cooling, the window 26 will enlarge and put the nozzle layer 14 (in the target zone where nozzle 16 will be produced) under tension.

Conversely, in an embodiment where heating of the laminate 30 places the nozzle layer 14 in tension, the lamination process (i.e., process of laminating the nozzle lid laminate) will be conducted at a lowered temperature relative to the temperature at which the material will be drilled or ablated. Typically, a large window 26 relative to the total size of the laminate 30 is provided, such that the laminate heating results in window size growth, thereby placing the polyimide in tension.

In order to control the temperature of the nozzle lid laminate 30 during the ablation process, heating or cooling of an ablation chuck 70 may be employed as shown in FIG. 7. An ablation chuck 70 is used to position the nozzle lid laminate 30 accurately under the path of the excimer laser beam during the ablation process. Sprocket holes 32 or other drive engaging means are provided in at least the lid layer 12 of the nozzle lid laminate 30 and are used to drive the laminate 30 during processing. The portion of the laminate 30 that is to be ablated is positioned over the ablation chuck 70, after which a vacuum is applied though vacuum port 72 and the laminate 30 is drawn flat against and secured to the chuck 70. The chuck includes wells 74 over which the nozzle portions 16 of the nozzle layer 14 are positioned. Wells 74 provide space surrounding the nozzle portions so that the chuck does not interfere with the ablation process. The wells 74 are also sealed off from the vacuum seal between the chuck 70 and the laminate 30.

In order to cool or heat the environment of the laminate 30, the chuck 70 may be provided with various heat exchange arrangement, such as the plumbing system 76 shown in FIG. 7, for example. When using a plumbing system, a coolant, such as liquid nitrogen, for example, could be circulated though the block of the chuck 70 to effectively cool the laminate to the desired operating temperature. Alternatively, a heated fluid, such as a heated oil can be circulated through the plumbing system 76 to elevate the laminate to a desired operating temperature. Alternative heating methods can be used, such as electrical resistance type heating, etc. can be applied directly to the block.

Figure 2:
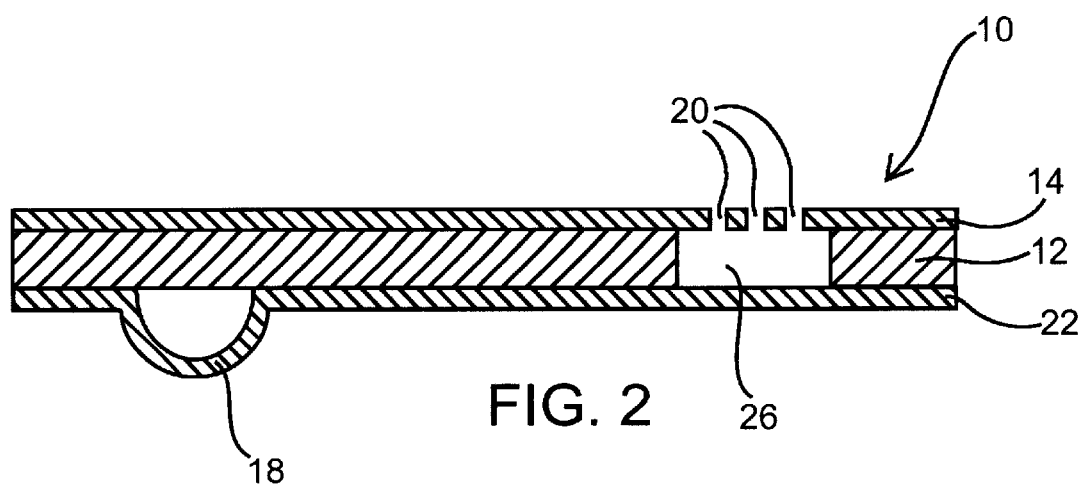
FIG. 2 is a longitudinal sectional view of FIG. 1.

After ablating the holes 20 into the nozzle layer 14 to form the nozzle 16, the vacuum is released from the chuck 70 and the nozzle lid layer is advanced beyond the chuck 70, where it is mated with and laminated to a blister layer 22 to complete the dosage form 10, as shown in FIG. 2.

The temperature variations between the processes of laminating the nozzle lid layer 30 and ablating the nozzle 16 place the target region of the nozzle layer 14 under tension to effectively remove wrinkles in the target region for accurate formation of the nozzle 16, as described above.

While the present invention has been described with reference to the specific embodiments thereof, it should be understood by those skilled in the art that various changes may be made and equivalents may be substituted without departing from the true spirit and scope of the invention. Although the above described processing is directed toward the formation of dosage forms, and particularly toward nozzles therefor, it is to be understood that such processes have a more general application to laser ablation of thin films, and particularly laminated thin films. In addition, many modifications may be made to adapt a particular situation, material, composition of matter, process, process step or steps, to the objective, spirit and scope of the present invention. All such modifications are intended to be within the scope of the claims appended hereto.

What is claimed is:

1. A method of ablating a thin layer comprising the steps of:
    laminating the thin layer with an additional layer to form a laminate under conditions comprising a first temperature; and
    directing pulses of LASER energy at the laminate, under conditions comprising a second temperature, in a manner which results in holes being drilled in the thin layer; wherein the first temperature is different from the second temperature and the thin layer has a coefficient of thermal expansion different from a coefficient of thermal expansion of the additional layer, such that after said laminating at said first temperature, the additional layer places the thin layer under tension at said second temperature.

2. The method of claim 1, wherein said first temperature is greater than said second temperature and said coefficient of thermal expansion of said additional layer is less than said coefficient of thermal expansion of said thin layer.

3. The method of claim 2, wherein said first temperature is about 25° C.±5° C. and said second temperature is in a range of from about −5 to −10° C.

4. The method of claim 2, wherein said thin layer has a coefficient of thermal expansion which is about 10% or more greater than the coefficient of thermal expansion of said additional layer.

5. The method of claim 4, wherein said thin layer comprises polyimide and said additional layer comprises polychloro trifluoroethylene and the second temperature is about 10% or more higher than the first temperature.

6. The method of claim 2, further comprising cooling an ablation chuck, which interfaces the laminate during said directing pulses, to achieve said second temperature.

7. The method of claim 6, wherein said cooling comprises circulating a coolant through the chuck.

8. The method of claim 7, wherein said coolant comprises liquid nitrogen.

9. The method of claim 1, wherein said first temperature is less than said second temperature and said coefficient of thermal expansion of said additional layer is greater than said coefficient of thermal expansion of said thin layer.

10. The method of claim 9, wherein said second temperature is achieved, at least partially, by absorption of laser energy by the additional layer.

11. The method of claim 9, further comprising heating an ablation chuck, which interfaces the laminate during said directing pulses, to achieve said second temperature.

12. The method of claim 11, wherein said heating comprises circulating a heated fluid through the chuck.

13. The method of claim 11, wherein said heating comprises heating the chuck by resistive electrical heating.

14. The method of claim 6, wherein said first temperature is about −5 to −10° C. and said second temperature is about 25° C.

15. The method of claim 9, wherein said additional layer has a coefficient of thermal expansion which is about 10% or more greater than the coefficient of thermal expansion of said thin layer.

16. The method of claim 15, wherein said thin layer comprises polyimide and said additional layer comprises aluminum.

17. A method, comprising:
    providing a laminate comprising a first layer and a second layer having a higher coefficient of thermal expansion than the first layer;
    directing pulses of LASER energy at the laminate in a manner which results in holes being drilled in the first layer; and
    allowing the second layer to absorb heat from the LASER pulses and expand laterally and thereby provide lateral force against the first layer.

18. The method of claim 17, wherein the first layer is comprises a first polymeric material and the second layer comprises a second polymeric material different from the first polymeric material.

19. The method of claim 17, wherein the LASER is an Excimer LASER.

* * * * *